(12) United States Patent
Natarajan et al.

(10) Patent No.: US 10,658,056 B2
(45) Date of Patent: May 19, 2020

(54) INTERNAL COPY TO HANDLE NAND PROGRAM FAIL

(71) Applicant: Intel Corporation, Santa Clara, CA (US)

(72) Inventors: Shankar Natarajan, Folsom, CA (US); Wayne Tran, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/852,785

(22) Filed: Dec. 22, 2017

(65) Prior Publication Data
US 2019/0180830 A1   Jun. 13, 2019

(51) Int. Cl.
| | |
|---|---|
| *G11C 29/52* | (2006.01) |
| *G11C 16/34* | (2006.01) |
| *G11C 29/00* | (2006.01) |
| *G11C 16/10* | (2006.01) |
| *G11C 16/04* | (2006.01) |
| *G11C 11/56* | (2006.01) |

(52) U.S. Cl.
CPC ...... *G11C 16/3459* (2013.01); *G11C 11/5621* (2013.01); *G11C 11/5628* (2013.01); *G11C 11/5642* (2013.01); *G11C 16/0483* (2013.01); *G11C 16/10* (2013.01); *G11C 16/102* (2013.01); *G11C 16/34* (2013.01); *G11C 16/3404* (2013.01); *G11C 16/3409* (2013.01); *G11C 16/3413* (2013.01); *G11C 16/3436* (2013.01); *G11C 16/3454* (2013.01); *G11C 16/3463* (2013.01); *G11C 29/72* (2013.01); *G11C 29/74* (2013.01)

(58) Field of Classification Search
CPC ............ G11C 16/3459; G11C 16/3463; G11C 16/3454; G11C 16/3436; G11C 16/3413; G11C 16/3409; G11C 16/3404; G11C 16/34; G11C 16/102; G11C 16/0483; G11C 16/10; G11C 11/5621; G11C 11/5642; G11C 11/5628; G11C 29/72; G11C 29/74
See application file for complete search history.

(56) References Cited

U.S. PATENT DOCUMENTS

| | | | | |
|---|---|---|---|---|
| 6,353,874 | B1* | 3/2002 | Morein | ............... G06F 12/0802 711/100 |
| 2010/0318721 | A1 | 12/2010 | Avila et al. | |
| 2013/0322171 | A1 | 12/2013 | Lee et al. | |
| 2015/0193302 | A1* | 7/2015 | Hyun | ..................... G11C 29/52 714/764 |

OTHER PUBLICATIONS

U.S. Appl. No. 15/637,481, entitled "Coarse pass and Fine Pass Multi-Level NVM Programming", filed on Jun. 29, 2017, 34 pages.

(Continued)

*Primary Examiner* — Sultana Begum
(74) *Attorney, Agent, or Firm* — Jordan IP Law, LLC

(57) ABSTRACT

An embodiment of a semiconductor package apparatus may include technology to attempt to program data in a first portion of a nonvolatile memory, determine if the attempt was successful, and recover the data to a second portion of the nonvolatile memory with an internal data move operation if the attempt is determined to be not successful. Other embodiments are disclosed and claimed.

16 Claims, 6 Drawing Sheets

(56) References Cited

OTHER PUBLICATIONS

Micron, "NAND Flash 101: An introduction to NAND flash and how to design it in to your next product", 2006, retrieved from micron.com/~/media/documents/products/technical-note/nand-flash/tn2919_nand_101.pdf, 27 pages.
European Search Report for European Patent Application No. 18207611.7, dated Apr. 25, 2019, 10 pages.

* cited by examiner

`US 10,658,056 B2`

INTERNAL COPY TO HANDLE NAND PROGRAM FAIL

TECHNICAL FIELD

Embodiments generally relate to memory systems. More particularly, embodiments relate to an internal copy to handle NAND program fail.

BACKGROUND

A multi-level non-volatile memory stores more than one bit per cell. Multi-level NAND memory having four (4) possible voltage levels per cell, may represent two (2) bits of data per cell. NAND memory having eight (8) voltage levels per cell may be referred to as triple-level cell (TLC) memory and may represent three (3) bits of data per cell. NAND memory having sixteen (16) voltage levels per cell may be referred to as quad-level cell (QLC) memory and may represent four (4) bits of data per cell. With some NAND flash devices, erasing a block may set all bit values to 1. Programming may refer to the process of changing a bit from a bit value of 1 to a bit value of 0. Various techniques such as error correction coding (ECC) and exclusive-or (XOR) parity may be used for correction of various memory errors.

BRIEF DESCRIPTION OF THE DRAWINGS

The various advantages of the embodiments will become apparent to one skilled in the art by reading the following specification and appended claims, and by referencing the following drawings, in which:

DESCRIPTION OF EMBODIMENTS

Various embodiments described herein may include a memory component and/or an interface to a memory component. Such memory components may include volatile and/or nonvolatile memory. Nonvolatile memory may be a storage medium that does not require power to maintain the state of data stored by the medium. In one embodiment, the memory device may include a block addressable memory device, such as those based on NAND or NOR technologies. A memory device may also include future generation nonvolatile devices, such as a three dimensional crosspoint memory device, or other byte addressable write-in-place nonvolatile memory devices. In one embodiment, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory. The memory device may refer to the die itself and/or to a packaged memory product. In particular embodiments, a memory component with non-volatile memory may comply with one or more standards promulgated by the Joint Electron Device Engineering Council (JEDEC), such as JESD218, JESD219, JESD220-1, JESD223B, JESD223-1, or other suitable standard (the JEDEC standards cited herein are available at jedec.org).

Volatile memory may be a storage medium that requires power to maintain the state of data stored by the medium. Non-limiting examples of volatile memory may include various types of RAM, such as dynamic random access memory (DRAM) or static random access memory (SRAM). One particular type of DRAM that may be used in a memory module is synchronous dynamic random access memory (SDRAM). In particular embodiments, DRAM of a memory component may comply with a standard promulgated by JEDEC, such as JESD79F for DDR SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, and JESD209-4 for LPDDR4 (these standards are available at www.jedec.org). Such standards (and similar standards) may be referred to as DDR-based standards and communication interfaces of the storage devices that implement such standards may be referred to as DDR-based interfaces.

Figure 1:
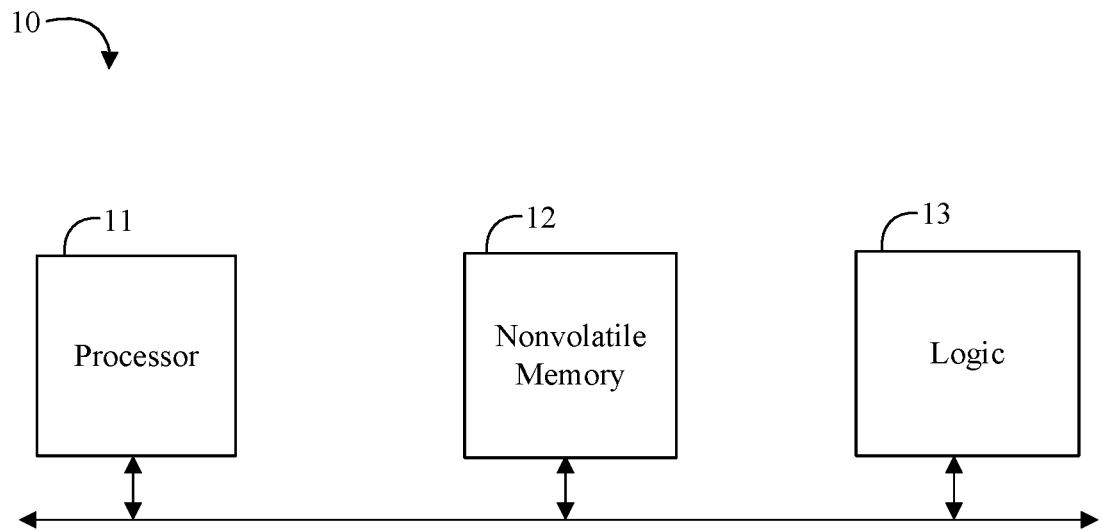
FIG. 1 is a block diagram of an example of an electronic processing system according to an embodiment.

Turning now to FIG. 1, an embodiment of an electronic processing system 10 may include a processor 11, nonvolatile memory 12, communicatively coupled to the processor 11, and logic 13 communicatively coupled to the processor 11 and the nonvolatile memory 12 to attempt to program data in a first portion of the nonvolatile memory 12, determine if the attempt was successful, and recover the data to a second portion of the nonvolatile memory 12 with an internal data move operation if the attempt is determined to be not successful. In some embodiments, the logic 13 may be configured to store the data in a cache of the nonvolatile memory 12 prior to the attempt, and recover the data from the cache of the nonvolatile memory 12 to the second portion of the nonvolatile memory 12 with the internal data move operation if the attempt is determined to be not successful. For example, the logic 13 may also be configured to determine if the data stored in the cache of the nonvolatile memory is valid prior to the recovery of the data. In some embodiments, the logic 13 may be further configured to move the data from the cache of the nonvolatile memory 12 to a temporary location of the nonvolatile memory 12 with the internal data move operation, and recover the data from the temporary location of the nonvolatile memory 12 to the second portion of the nonvolatile memory 12 with the internal data move operation. In some embodiments, the logic 13 may also be configured to move previously programmed data from the first portion of nonvolatile memory 12 to the second portion of the nonvolatile memory 12 with the internal data move operation if the attempt is determined to be not successful. For example, the nonvolatile memory 12 may include a NAND memory. In some embodiments, the logic 13 may be located in, or co-located with, various components, including the processor 11 (e.g., on a same die).

Embodiments of each of the above processor 11, nonvolatile memory 12, logic 13, and other system components may be implemented in hardware, software, or any suitable combination thereof. For example, hardware implementations may include configurable logic such as, for example, programmable logic arrays (PLAs), field programmable gate arrays (FPGAs), complex programmable logic devices (CPLDs), or fixed-functionality logic hardware using circuit technology such as, for example, application specific integrated circuit (ASIC), complementary metal oxide semiconductor (CMOS) or transistor-transistor logic (TTL) technology, or any combination thereof.

Alternatively, or additionally, all or portions of these components may be implemented in one or more modules as a set of logic instructions stored in a machine- or computer-readable storage medium such as random access memory (RAM), read only memory (ROM), programmable ROM (PROM), firmware, flash memory, etc., to be executed by a processor or computing device. For example, computer program code to carry out the operations of the components may be written in any combination of one or more operating system (OS) applicable/appropriate programming languages, including an object-oriented programming language such as PYTHON, PERL, JAVA, SMALLTALK, C++, C# or the like and conventional procedural programming languages, such as the "C" programming language or similar programming languages. For example, the nonvolatile memory 12, persistent storage media, or other system memory may store a set of instructions which when executed by the processor 11 cause the system 10 to implement one or more components, features, or aspects of the system 10 (e.g., the logic 13, attempting to program data in a first portion of a nonvolatile memory, determining if the attempt was successful, recovering the data to a second portion of the nonvolatile memory with an internal data move operation if the attempt is determined to be not successful, etc.).

Figure 2:
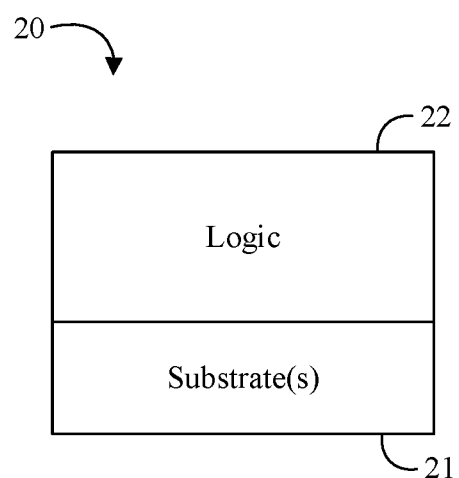
FIG. 2 is a block diagram of an example of a semiconductor package apparatus according to an embodiment.

Turning now to FIG. 2, an embodiment of a semiconductor package apparatus 20 may include one or more substrates 21, and logic 22 coupled to the one or more substrates 21, wherein the logic 22 is at least partly implemented in one or more of configurable logic and fixed-functionality hardware logic. The logic 22 coupled to the one or more substrates may be configured to attempt to program data in a first portion of a nonvolatile memory, determine if the attempt was successful, and recover the data to a second portion of the nonvolatile memory with an internal data move operation if the attempt is determined to be not successful. In some embodiments, the logic 22 may be configured to store the data in a cache of the nonvolatile memory prior to the attempt, and recover the data from the cache of the nonvolatile memory to the second portion of the nonvolatile memory with the internal data move operation if the attempt is determined to be not successful. For example, the logic 22 may also be configured to determine if the data stored in the cache of the nonvolatile memory is valid prior to the recovery of the data. In some embodiments, the logic 22 may be further configured to move the data from the cache of the nonvolatile memory to a temporary location of the nonvolatile memory with the internal data move operation, and recover the data from the temporary location of the nonvolatile memory to the second portion of the nonvolatile memory with the internal data move operation. In some embodiments, the logic 22 may also be configured to move previously programmed data from the first portion of nonvolatile memory to the second portion of the nonvolatile memory with the internal data move operation if the attempt is determined to be not successful. For example, the nonvolatile memory may include a NAND memory.

Embodiments of logic 22, and other components of the apparatus 20, may be implemented in hardware, software, or any combination thereof including at least a partial implementation in hardware. For example, hardware implementations may include configurable logic such as, for example, PLAs, FPGAs, CPLDs, or fixed-functionality logic hardware using circuit technology such as, for example, ASIC, CMOS, or TTL technology, or any combination thereof. Additionally, portions of these components may be implemented in one or more modules as a set of logic instructions stored in a machine- or computer-readable storage medium such as RAM, ROM, PROM, firmware, flash memory, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C# or the like and conventional procedural programming languages, such as the "C" programming language or similar programming languages.

Figure 3A:
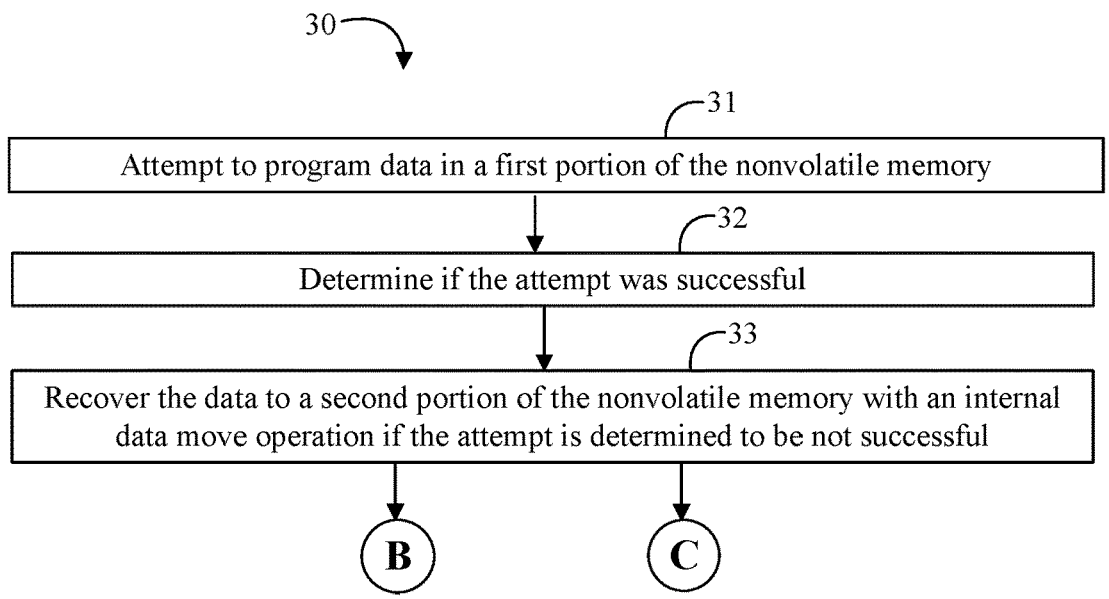
FIGS. 3A to 3C are flowcharts of an example of a method of recovering data according to an embodiment.
Figure 3B:
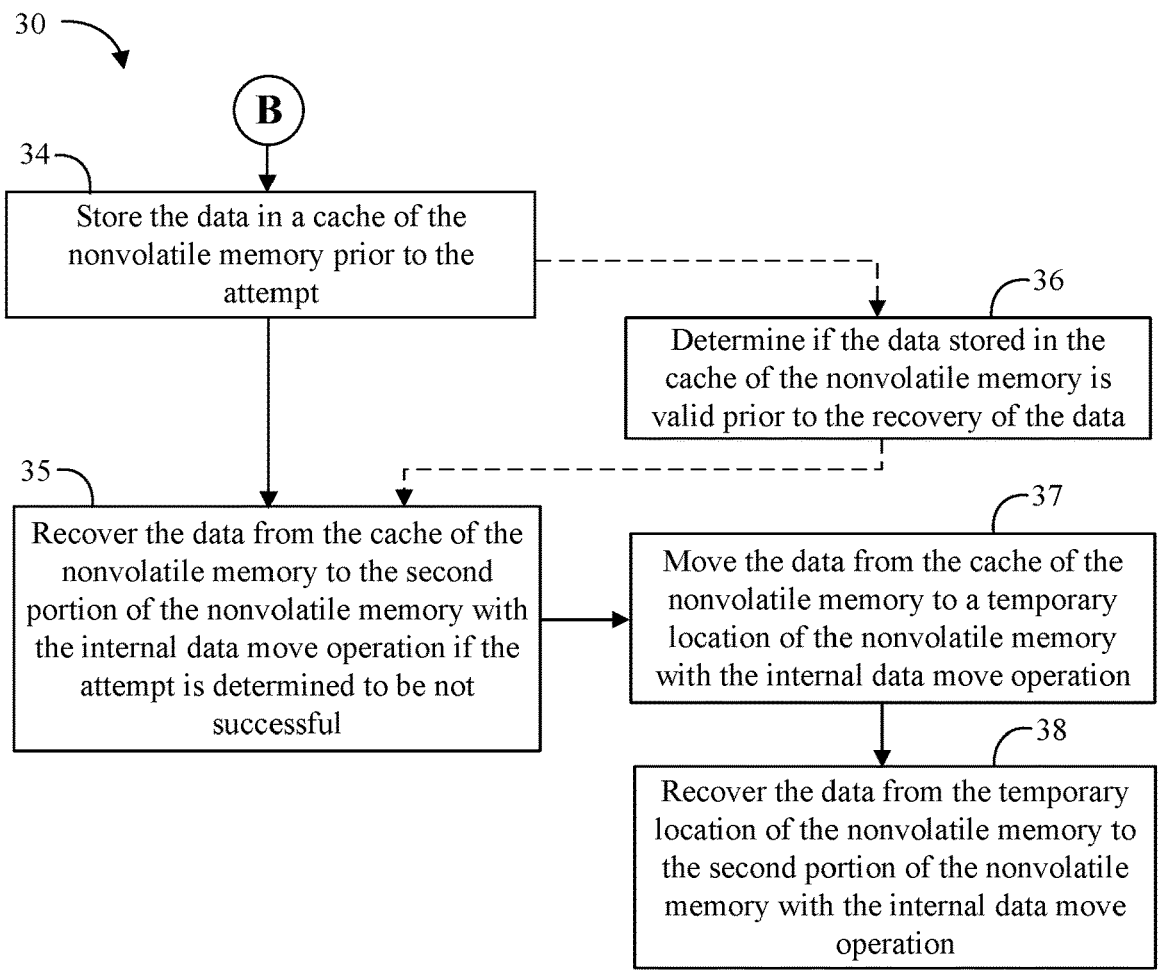
Figure 3C:
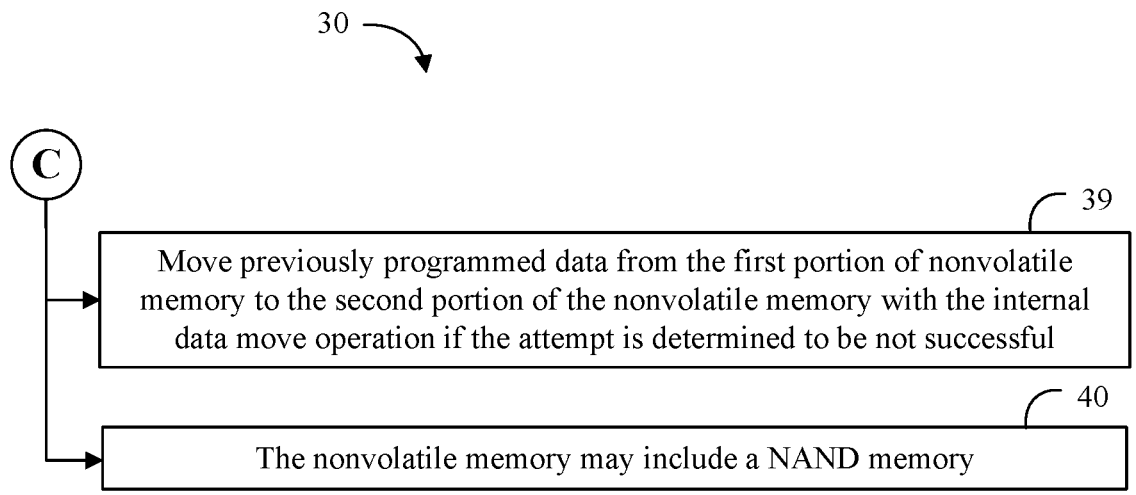

Turning now to FIGS. 3A to 3C, an embodiment of a method 30 of recovering data may include attempting to program data in a first portion of a nonvolatile memory at block 31, determining if the attempt was successful at block 32, and recovering the data to a second portion of the nonvolatile memory with an internal data move operation if the attempt is determined to be not successful, at block 33. Some embodiments of the method 30 may include storing the data in a cache of the nonvolatile memory prior to the attempt at block 34, and recovering the data from the cache of the nonvolatile memory to the second portion of the nonvolatile memory with the internal data move operation if the attempt is determined to be not successful, at block 35. For example, the method 30 may also include determining if the data stored in the cache of the nonvolatile memory is valid prior to the recovery of the data, at block 36. Some embodiments of the method 30 may further include moving the data from the cache of the nonvolatile memory to a temporary location of the nonvolatile memory with the internal data move operation at block 37, and recovering the data from the temporary location of the nonvolatile memory to the second portion of the nonvolatile memory with the internal data move operation at block 38. Some embodiments of the method 30 may further include moving previously programmed data from the first portion of nonvolatile memory to the second portion of the nonvolatile memory with the internal data move operation if the attempt is determined to be not successful, at block 39. For example, the nonvolatile memory may include a NAND memory at block 40.

Embodiments of the method 30 may be implemented in a system, apparatus, computer, device, etc., for example, such as those described herein. More particularly, hardware implementations of the method 30 may include configurable logic such as, for example, PLAs, FPGAs, CPLDs, or in fixed-functionality logic hardware using circuit technology such as, for example, ASIC, CMOS, or TTL technology, or any combination thereof. Alternatively, or additionally, the method 30 may be implemented in one or more modules as a set of logic instructions stored in a machine- or computer-readable storage medium such as RAM, ROM, PROM, firmware, flash memory, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C# or the like and conventional procedural programming languages, such as the "C" programming language or similar programming languages.

For example, the method 30 may be implemented on a computer readable medium as described in connection with Examples 19 to 24 below. Embodiments or portions of the method 30 may be implemented in firmware, applications (e.g., through an application programming interface (API)), or driver software running on an operating system (OS).

Figure 4:
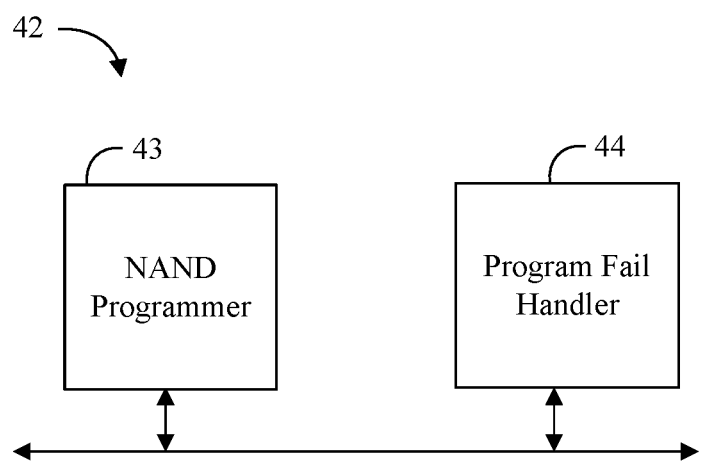
FIG. 4 is a block diagram of an example of a memory controller according to an embodiment.

Turning now to FIG. 4, an embodiment of a memory controller 42 may include a NAND programmer 43 and a program fail handler 44. The NAND programmer 43 may include technology to program data in a first block of a NAND memory. The program fail handler 44 may include technology to determine if the programming of the first block failed, and to recover the data to a second block of the NAND memory with an internal data move command if the programming of the first block failed. In some embodiments, the NAND programmer 43 may be configured to store the data in a cache of the NAND memory prior to the attempt, and the program fail handler 44 may recover the data from the cache of the NAND memory to the second block of the NAND memory with the internal data move command if the programming of the first block failed. For example, program fail handler 44 may also be configured to determine if the data stored in the cache of the NAND memory is valid prior to the recovery of the data. In some embodiments, the program fail handler 44 may be further configured to move the data from the cache of the NAND memory to a single-level cell (SLC) block of the NAND memory with the internal data move command, and recover the data from the SLC block to the second block of the NAND memory with the internal data move command. In some embodiments, the program fail handler 44 may also be configured to move previously programmed data from the first block of NAND memory to the second block of the NAND memory with the internal data move command if the programming of the first block failed.

Embodiments of the NAND programmer 43, the program fail handler 44, and other components of the memory controller 42, may be implemented in hardware, software, or any combination thereof including at least a partial implementation in hardware. For example, hardware implementations may include configurable logic such as, for example, PLAs, FPGAs, CPLDs, or fixed-functionality logic hardware using circuit technology such as, for example, ASIC, CMOS, or TTL technology, or any combination thereof. Additionally, portions of these components may be implemented in one or more modules as a set of logic instructions stored in a machine- or computer-readable storage medium such as RAM, ROM, PROM, firmware, flash memory, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C# or the like and conventional procedural programming languages, such as the "C" programming language or similar programming languages.

Some embodiments may advantageously provide program fail handling for DRAM-less and/or fire and forget systems. Some high performance SSDs may return a completion status to the host after data is written to the SSD write buffer (e.g., a DRAM or SRAM memory component in the SSD). Waiting for the NAND of the SSD to return a passing program status may slow down SSD write performance. Firmware may handle a NAND program failure to recover user data with little or no impact to the SSD write performance. After a program failure, for example, firmware may reprogram the data to another NAND block. To achieve a high or the highest write performance, some SSDs may implement what may be referred to as a fire and forget policy. For example, a fire and forget implementation may remove data from the SSD write buffer once the data is written to the NAND buffer. With a fire and forget implementation, the firmware cannot retrieve data from the SSD write buffer to reprogram to another NAND block (e.g., in the event of a NAND program failure). Some SDDs may not have a DRAM or SRAM component to store data to handle a NAND program failure, or some SSDs may not have sufficient extra DRAM or SRAM capacity to handle a NAND program failure. Some SSDs may use XOR techniques to recover data following a NAND program failure. However, not all program failures may be recovered by utilizing XOR techniques (e.g., and not all SSDs have such XOR support).

Some embodiments may advantageously provide efficient technology to recover some NAND program failures through an internal NAND data move. In some embodiments, no SRAM/DRAM buffer sharing may be involved with the data recovery. Some embodiments may be scalable and may be extended for SLC, multi-level cell, tri-level cell (TLC), and/or quad-level cell (QLC) NAND program fails. In some embodiments, a system implementation may include a firmware technique to move the failed page data as well as all of the previously programmed data from the failed block to a new block through a NAND internal copy. Some embodiments may provide comprehensive technology to recover from a program fail that supports most or all fail types including, for example, single tile group fails (4K), multi tile group or single plane fails (16K), and/or multi plane fails (e.g., x2, x3, x4). Some embodiments may be compatible with a fire and forget implementation where the system may release the data from the faster volatile cache once it is fired to NAND. Some embodiments may further provide a faster technique to recover the data and complete the recovery process, and may include no SRAM/DRAM resources sharing during the program fail handling.

An example NAND device architecture layout may include one or more cache registers, one or more data registers, and an associated NAND array. For example, the NAND array may be logically or physically arranged as one or more planes. Each plane of the NAND array may be further logically or physically arranged as one or more blocks. In some embodiments, when data to be programmed is sent to the NAND memory the data may be staged in the cache register first. From the cache register, the data may be moved to the NAND array. When a program failure occurs, the failure generally refers to NAND array write failures. In some circumstances, a copy of the data may still be available in the cache register unless new data has been written to the cache register. For non-cached program commands, for example, the data in the cache register may not be overwritten until the next program command is issued. In accordance with some embodiments, the NAND controller may detect program status fails before issuing the next program command and may recover the data by reading it from the cache register. For example, internal "copy back read" and "copy back program" commands may allow the NAND controller to read the data from the array to the cache register and/or to move data from the cache register to the NAND array. Some embodiments may advantageously utilize the NAND architecture and internal data movement commands to provide recovery from some NAND program failures (e.g., and may be applicable for most or all NAND types including TLC and QLC).

Figure 5:
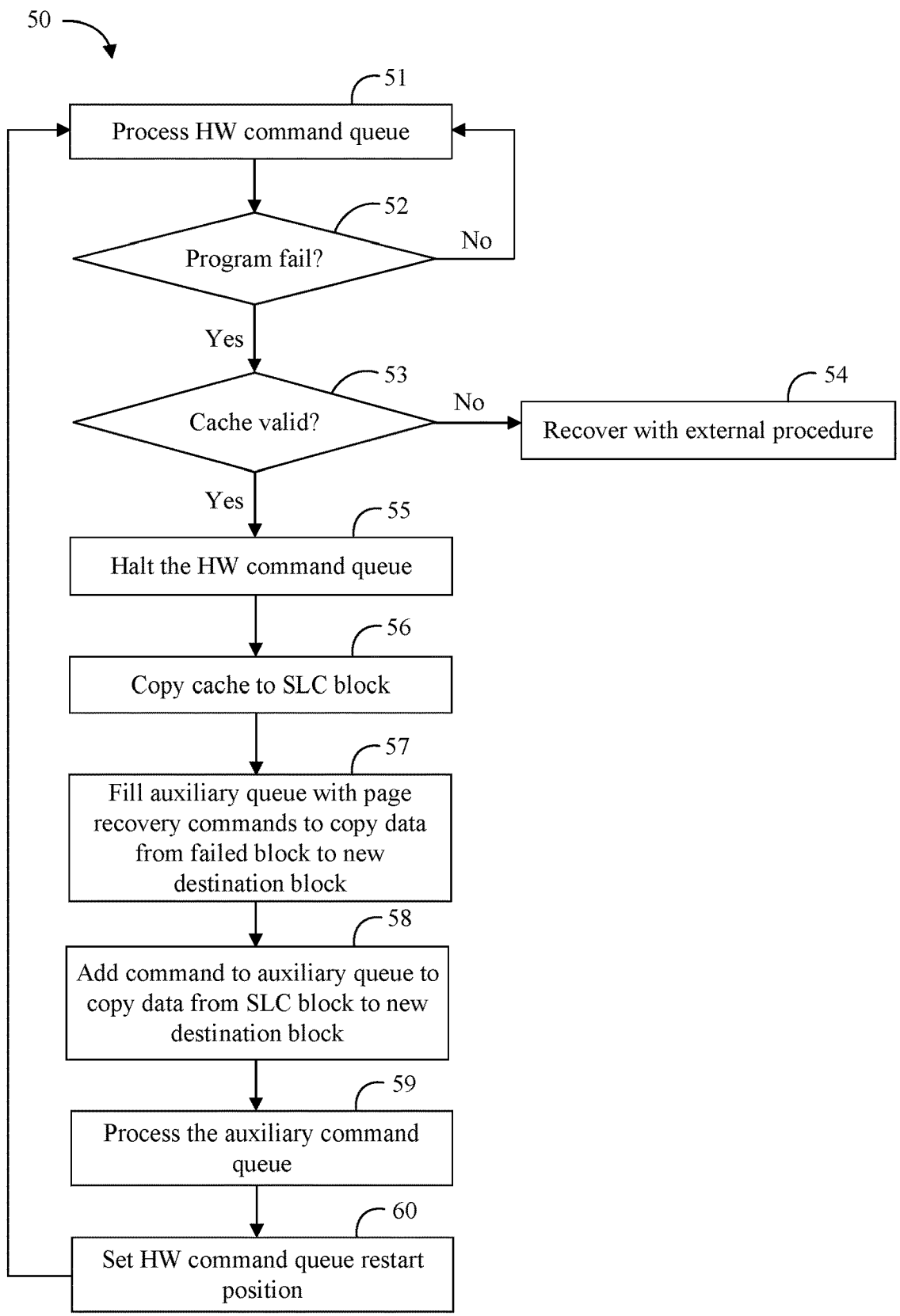
FIG. 5 is a flowchart of another example of a method of recovering data according to an embodiment.

Turning now to FIG. 5, an embodiment of a method 50 of recovering data may include processing a command queue at block 51. For example, a NAND controller may maintain a hardware (HW) command queue and NAND commands from the HW queue may be executed in a first in, first out (FIFO) technique. When a NAND program command is in the HW queue, the method 50 may follow the NAND program command with a determination if the program failed at block 52. For example, the NAND controller may read status information to check for program completion. If the program of the data was successful at block 52, the method 50 may continue to process the command queue at block 51. If the program failed at block 52, the method 50 may next determine if the data stored in the cache is still valid at block 53. The program data may be preserved in the cache registers within the NAND die until the data is overwritten with a next program command. For example, the NAND controller may check status bits which indicate if the controller is ready to accept new commands (e.g., which may correspond to a potential overwrite of the cache data). If the cache data is not valid at block 53, any suitable external recovery procedure may be utilized at block 54 to recover the data. If the cache data is determined to be valid at block 54, recovery of the failing page from within the NAND device may proceed.

The method 50 may halt the HW command queue at block 55, and copy the data from the cache to a SLC block at block 56. For example, some embodiments may utilize a "copyback program" command (e.g., command code 85-10h) to write the cache register data to an SLC block (e.g., which may be specifically reserved for program fail handling). The method 50 may then fill an auxiliary (AUX) command queue with an appropriate sequence of page recovery commands to copy data from the failed block to a new destination block, at block 57. For example, the recovery command sequence may include internal data movement commands to copy valid pages from the failed block up until the failed page into the new destination block. The firmware (FW) may fill the AUX queue commands. For example, in some embodiments the AUX queue may be filled with appropriate "copyback read" commands (e.g., command code 00-35h) and "copyback program" commands (e.g., command code 00-85h) from page 0 to a last valid page (e.g., n−1, where n corresponds to the failed page). The read may be performed from the failed block, while the program may be to the new destination block.

The method 50 may then add appropriate commands to the AUX queue to copy data from the SLC block to the new destination block at block 58. For the original failed page data, for example, some embodiment may utilize a "copyback read" command to fetch the data from the SLC block that preserves the failed page data and a "copyback program" command which points to the new destination block. The method 50 may then process the AUX command queue at block 59, set the HW command queue restart position at block 60, and continue to process the HW command queue at block 51 (e.g., after the recovery is done, the NAND command queue will restart). For example, after the copy back process is complete, the FW may trace the last command that was successfully executed by the HW command queue and restart from the next command.

Figure 6:
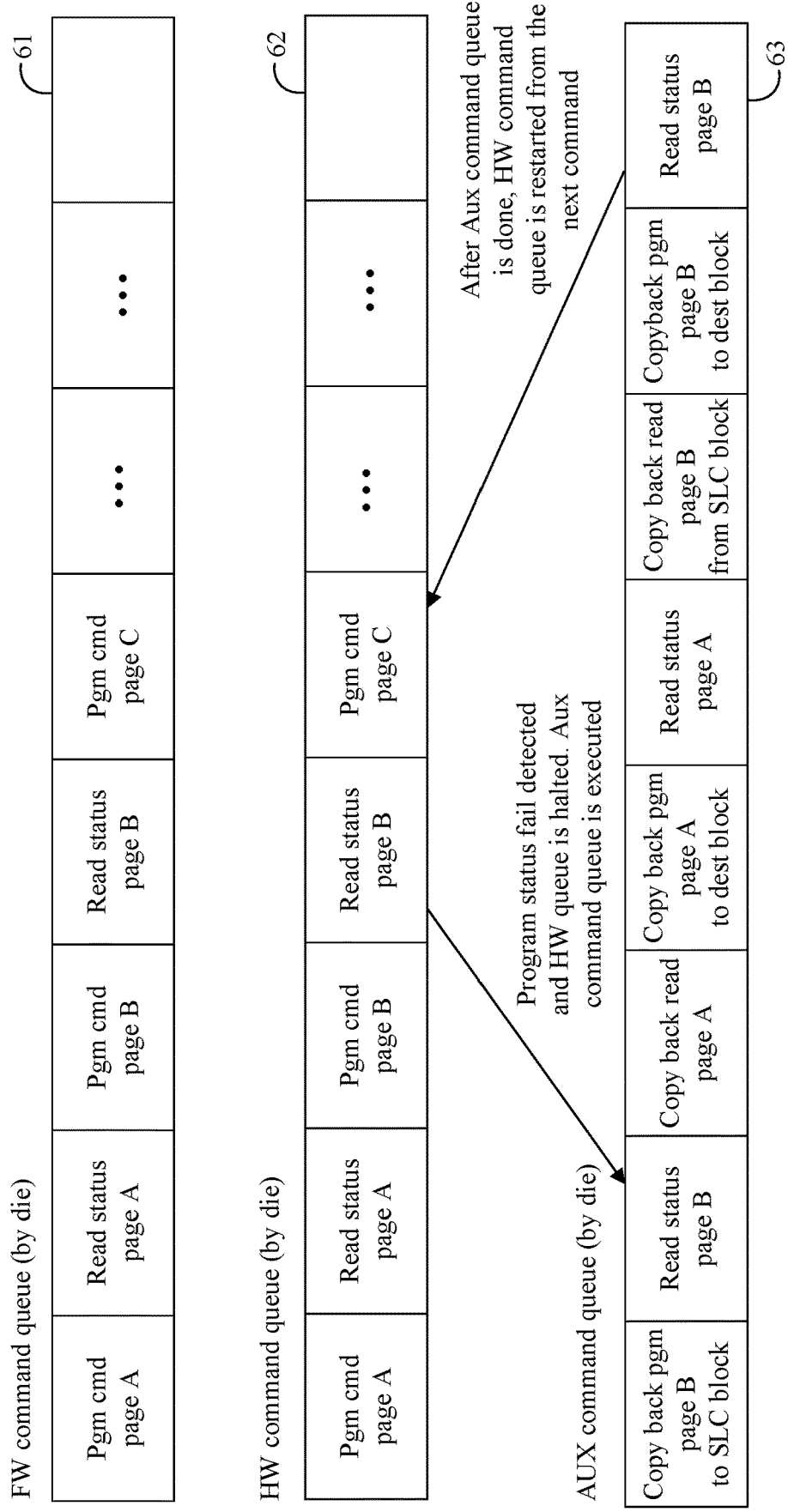
FIG. 6 is an illustrative diagram of examples of various command queues according to an embodiment.

Turning now to FIG. 6, an embodiment of an illustrative command queue management to recover program failures may include a FW command queue 61 (e.g., by die), a HW command queue 62 (e.g., by die), and an AUX command queue 63 (e.g., by die). The FW command queue 61 may include an example sequence of commands including a program command for page A (e.g., command code 80-10h), followed by a read status command for page A (e.g., command code 70h), followed by a program command for page B, followed by a read status command for page B, followed by a program command for page C, followed by a read status command for page C, and so on. The FW command queue 61 may cause a similar sequence of commands to be filled in the HW command queue 62.

The program command for page A may complete successfully, such that the read status command for page A indicates a successful completion. The program command for page B may fail, such that the read status command indicates that the program failed. The HW queue may be halted and the AUX command queue 63 may be filled with a sequence of commands to recover the page data. The recovery command sequence may include a copy back program command to move the page B data to an SLC block (e.g., command code 00-85h), followed by a read status command for page B, followed by a copy back read command to read the page A data (e.g., command code 00-35h), followed by a copy back program command to move the page A data to a new destination block, followed by a read status command for page A, followed by a copy back read command to read the page B data from the SLC block, followed by a copy back program command to move the page B data to the destination block, followed by a read status command for the page B data. After the AUX command queue 63 is done, the HW command queue 62 may be restarted from the next command to program page C. Some embodiments may advantageously provide system management of the AUX command queue 63 to recover a program failure.

Figure 7:
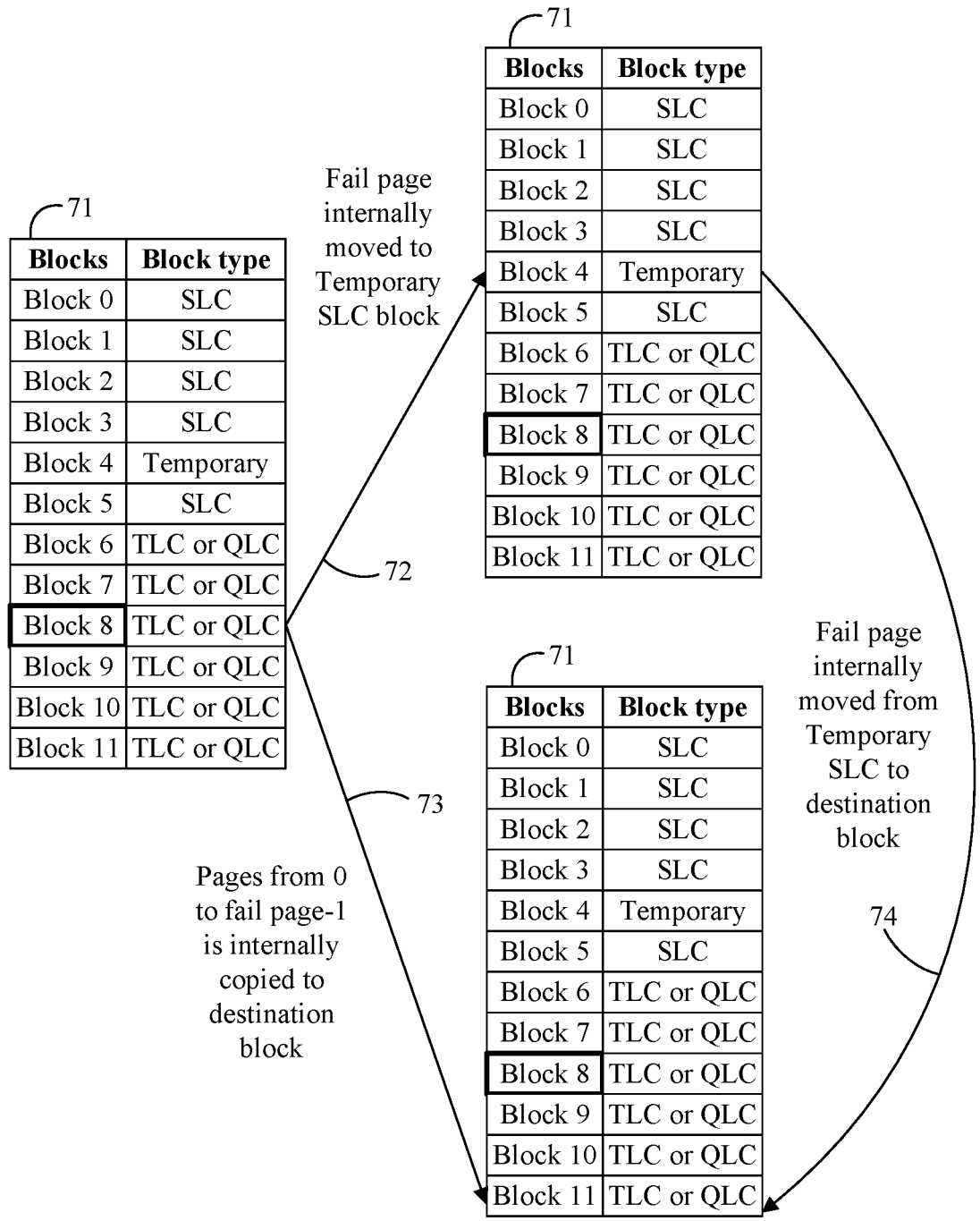
FIG. 7 is an illustrative diagram of an example of data movement according to an embodiment.

Turning now to FIG. 7, an embodiment of an illustrative data movement for data recovery may include a SLC block usage model. For example, a SLC block may be utilized as a temporary block used primarily for program fail recovery. The SLC block reserved for program fail recovery may be any block from the SLC pool. A portion 71 of NAND memory may include blocks 0 through 11 with corresponding block types. For examples, blocks 0 through 5 may be SLC blocks, while blocks 6 through 11 may be TLC or QLC blocks. Block 4 may be reserved as a temporary block for program fail recovery. In an illustrative operation example, an attempt to program block 8 may fail. In some embodiments, a NAND controller may determine that the attempt was not successful and internally move the fail page data to the temporary SLC block 4, as indicated by the arrow 72. The NAND controller may then internally copy block 8 pages from zero (0) to fail page—1 to a new destination block 11 (e.g., copying valid pages from the failed block up until the failed page), as indicated by the arrow 73. The NAND controller may then internally move the fail page data from temporary SLC block 4 to the destination block 11, as indicated by the arrow 74.

In some embodiments, there may be some ECC risk with an internal block copy. For example, there may be some risk in moving data internally within NAND blocks because the data is not read out through an ECC engine. In some embodiments, the ECC risk may be mitigated by a tighter raw bit error rate (RBER) screen at the NAND component. Because SLC utilizes a single-level placement, the programming of the fail page data may be done by applying a single pulse to the selected write line with no verify step. Such SLC programming may be very fast (e.g., performed in 250 µs or less) and advantageously may not require external error correction. In some embodiments, the size of the available SLC memory for the reserved program fail recovery may be pre-configured or may be configured dynamically.

ADDITIONAL NOTES AND EXAMPLES

Example 1 may include an electronic processing system, comprising a processor, nonvolatile memory communicatively coupled to the processor, and logic communicatively coupled to the processor and the nonvolatile memory to attempt to program data in a first portion of the nonvolatile memory, determine if the attempt was successful, and recover the data to a second portion of the nonvolatile memory with an internal data move operation if the attempt is determined to be not successful.

Example 2 may include the system of Example 1, wherein the logic is further to store the data in a cache of the nonvolatile memory prior to the attempt, and recover the data from the cache of the nonvolatile memory to the second portion of the nonvolatile memory with the internal data move operation if the attempt is determined to be not successful.

Example 3 may include the system of Example 2, wherein the logic is further to determine if the data stored in the cache of the nonvolatile memory is valid prior to the recovery of the data.

Example 4 may include the system of Example 3, wherein the logic is further to move the data from the cache of the nonvolatile memory to a temporary location of the nonvolatile memory with the internal data move operation, and recover the data from the temporary location of the nonvolatile memory to the second portion of the nonvolatile memory with the internal data move operation.

Example 5 may include the system of Example 4, wherein the logic is further to move previously programmed data from the first portion of nonvolatile memory to the second portion of the nonvolatile memory with the internal data move operation if the attempt is determined to be not successful.

Example 6 may include the system of any of Examples 1 to 5, wherein the nonvolatile memory comprises a NAND memory.

Example 7 may include a semiconductor package apparatus, comprising one or more substrates, and logic coupled to the one or more substrates, wherein the logic is at least partly implemented in one or more of configurable logic and fixed-functionality hardware logic, the logic coupled to the one or more substrates to attempt to program data in a first portion of a nonvolatile memory, determine if the attempt was successful, and recover the data to a second portion of the nonvolatile memory with an internal data move operation if the attempt is determined to be not successful.

Example 8 may include the apparatus of Example 7, wherein the logic is further to store the data in a cache of the nonvolatile memory prior to the attempt, and recover the data from the cache of the nonvolatile memory to the second portion of the nonvolatile memory with the internal data move operation if the attempt is determined to be not successful.

Example 9 may include the apparatus of Example 8, wherein the logic is further to determine if the data stored in the cache of the nonvolatile memory is valid prior to the recovery of the data.

Example 10 may include the apparatus of Example 9, wherein the logic is further to move the data from the cache of the nonvolatile memory to a temporary location of the nonvolatile memory with the internal data move operation, and recover the data from the temporary location of the nonvolatile memory to the second portion of the nonvolatile memory with the internal data move operation.

Example 11 may include the apparatus of Example 10, wherein the logic is further to move previously programmed data from the first portion of nonvolatile memory to the second portion of the nonvolatile memory with the internal data move operation if the attempt is determined to be not successful.

Example 12 may include the apparatus of any of Examples 7 to 11, wherein the nonvolatile memory comprises a NAND memory.

Example 13 may include a method of recovering data, comprising attempting to program data in a first portion of a nonvolatile memory, determining if the attempt was successful, and recovering the data to a second portion of the nonvolatile memory with an internal data move operation if the attempt is determined to be not successful.

Example 14 may include the method of Example 13, further comprising storing the data in a cache of the nonvolatile memory prior to the attempt, and recovering the data from the cache of the nonvolatile memory to the second portion of the nonvolatile memory with the internal data move operation if the attempt is determined to be not successful.

Example 15 may include the method of Example 14, further comprising determining if the data stored in the cache of the nonvolatile memory is valid prior to the recovery of the data.

Example 16 may include the method of Example 15, further comprising moving the data from the cache of the nonvolatile memory to a temporary location of the nonvolatile memory with the internal data move operation, and recovering the data from the temporary location of the nonvolatile memory to the second portion of the nonvolatile memory with the internal data move operation.

Example 17 may include the method of Example 16, further comprising moving previously programmed data from the first portion of nonvolatile memory to the second portion of the nonvolatile memory with the internal data move operation if the attempt is determined to be not successful.

Example 18 may include the method of any of Examples 13 to 17, wherein the nonvolatile memory comprises a NAND memory.

Example 19 may include at least one computer readable medium, comprising a set of instructions, which when executed by a computing device, cause the computing device to attempt to program data in a first portion of a nonvolatile memory, determine if the attempt was successful, and recover the data to a second portion of the nonvolatile memory with an internal data move operation if the attempt is determined to be not successful.

Example 20 may include the at least one computer readable medium of Example 19, comprising a further set of instructions, which when executed by the computing device, cause the computing device to store the data in a cache of the nonvolatile memory prior to the attempt, and recover the data from the cache of the nonvolatile memory to the second portion of the nonvolatile memory with the internal data move operation if the attempt is determined to be not successful.

Example 21 may include the at least one computer readable medium of Example 20, comprising a further set of instructions, which when executed by the computing device, cause the computing device to determine if the data stored in the cache of the nonvolatile memory is valid prior to the recovery of the data.

Example 22 may include the at least one computer readable medium of Example 21, comprising a further set of instructions, which when executed by the computing device, cause the computing device to move the data from the cache of the nonvolatile memory to a temporary location of the nonvolatile memory with the internal data move operation, and recover the data from the temporary location of the nonvolatile memory to the second portion of the nonvolatile memory with the internal data move operation.

Example 23 may include the at least one computer readable medium of Example 22, comprising a further set of instructions, which when executed by the computing device, cause the computing device to move previously programmed data from the first portion of nonvolatile memory to the second portion of the nonvolatile memory with the internal data move operation if the attempt is determined to be not successful.

Example 24 may include the at least one computer readable medium of any of Examples 19 to 23, wherein the nonvolatile memory comprises a NAND memory.

Example 25 may include a memory controller apparatus, comprising means for attempting to program data in a first portion of a nonvolatile memory, means for determining if the attempt was successful, and means for recovering the data to a second portion of the nonvolatile memory with an internal data move operation if the attempt is determined to be not successful.

Example 26 may include the apparatus of Example 25, further comprising means for storing the data in a cache of the nonvolatile memory prior to the attempt, and means for recovering the data from the cache of the nonvolatile memory to the second portion of the nonvolatile memory with the internal data move operation if the attempt is determined to be not successful.

Example 27 may include the apparatus of Example 26, further comprising means for determining if the data stored in the cache of the nonvolatile memory is valid prior to the recovery of the data.

Example 28 may include the apparatus of Example 27, further comprising means for moving the data from the cache of the nonvolatile memory to a temporary location of the nonvolatile memory with the internal data move operation, and means for recovering the data from the temporary location of the nonvolatile memory to the second portion of the nonvolatile memory with the internal data move operation.

Example 29 may include the apparatus of Example 28, further comprising means for moving previously programmed data from the first portion of nonvolatile memory to the second portion of the nonvolatile memory with the internal data move operation if the attempt is determined to be not successful.

Example 30 may include the apparatus of any of Examples 25 to 29, wherein the nonvolatile memory comprises a NAND memory.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrase "one or more of A, B, and C" and the phrase "one or more of A, B, or C" both may mean A; B; C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. An electronic processing system, comprising:
a processor;
nonvolatile memory communicatively coupled to the processor; and
logic communicatively coupled to the processor and the nonvolatile memory to:

attempt to program data in a first portion of the nonvolatile memory,
store the data in a cache of the nonvolatile memory prior to the attempt,
determine if the attempt was successful,
determine if the data stored in the cache of the nonvolatile memory is valid prior to recovery of the data, and
recover the data from the cache of the nonvolatile memory to a second portion of the nonvolatile memory with an internal data move operation if the attempt is determined to be not successful.

2. The system of claim 1, wherein the logic is further to:
move the data from the cache of the nonvolatile memory to a temporary location of the nonvolatile memory with the internal data move operation; and
recover the data from the temporary location of the nonvolatile memory to the second portion of the nonvolatile memory with the internal data move operation.

3. The system of claim 2, wherein the logic is further to:
move previously programmed data from the first portion of the nonvolatile memory to the second portion of the nonvolatile memory with the internal data move operation if the attempt is determined to be not successful.

4. The system of claim 1, wherein the nonvolatile memory comprises a NAND memory.

5. A semiconductor package apparatus, comprising:
one or more substrates; and
logic coupled to the one or more substrates, wherein the logic is at least partly implemented in one or more of configurable logic and fixed-functionality hardware logic, the logic coupled to the one or more substrates to:
attempt to program data in a first portion of a nonvolatile memory,
store the data in a cache of the nonvolatile memory prior to the attempt,
determine if the attempt was successful,
determine if the data stored in the cache of the nonvolatile memory is valid prior to recovery of the data, and
recover the data from the cache of the nonvolatile memory to a second portion of the nonvolatile memory with an internal data move operation if the attempt is determined to be not successful.

6. The apparatus of claim 5, wherein the logic is further to:
move the data from the cache of the nonvolatile memory to a temporary location of the nonvolatile memory with the internal data move operation; and
recover the data from the temporary location of the nonvolatile memory to the second portion of the nonvolatile memory with the internal data move operation.

7. The apparatus of claim 6, wherein the logic is further to:
move previously programmed data from the first portion of the nonvolatile memory to the second portion of the nonvolatile memory with the internal data move operation if the attempt is determined to be not successful.

8. The apparatus of claim 5, wherein the nonvolatile memory comprises a NAND memory.

9. A method of recovering data, comprising:
attempting to program data in a first portion of a nonvolatile memory;
storing the data in a cache of the nonvolatile memory prior to the attempt;
determining if the attempt was successful;
determining if the data stored in the cache of the nonvolatile memory is valid prior to recovery of the data; and
recovering the data from the cache of the nonvolatile memory to a second portion of the nonvolatile memory with an internal data move operation if the attempt is determined to be not successful.

10. The method of claim 9, further comprising:
moving the data from the cache of the nonvolatile memory to a temporary location of the nonvolatile memory with the internal data move operation; and
recovering the data from the temporary location of the nonvolatile memory to the second portion of the nonvolatile memory with the internal data move operation.

11. The method of claim 10, further comprising:
moving previously programmed data from the first portion of the nonvolatile memory to the second portion of the nonvolatile memory with the internal data move operation if the attempt is determined to be not successful.

12. The method of claim 9, wherein the nonvolatile memory comprises a NAND memory.

13. At least one computer readable medium, comprising a set of instructions, which when executed by a computing device, cause the computing device to:
attempt to program data in a first portion of a nonvolatile memory;
store the data in a cache of the nonvolatile memory prior to the attempt;
determine if the attempt was successful;
determine if the data stored in the cache of the nonvolatile memory is valid prior to recovery of the data; and
recover the data from the cache of the nonvolatile memory to a second portion of the nonvolatile memory with an internal data move operation if the attempt is determined to be not successful.

14. The at least one computer readable medium of claim 13, comprising a further set of instructions, which when executed by the computing device, cause the computing device to:
move the data from the cache of the nonvolatile memory to a temporary location of the nonvolatile memory with the internal data move operation; and
recover the data from the temporary location of the nonvolatile memory to the second portion of the nonvolatile memory with the internal data move operation.

15. The at least one computer readable medium of claim 14, comprising a further set of instructions, which when executed by the computing device, cause the computing device to:
move previously programmed data from the first portion of the nonvolatile memory to the second portion of the nonvolatile memory with the internal data move operation if the attempt is determined to be not successful.

16. The at least one computer readable medium of claim 13, wherein the nonvolatile memory comprises a NAND memory.

* * * * *